(12) United States Patent
Luo et al.

(10) Patent No.: US 11,349,085 B2
(45) Date of Patent: May 31, 2022

(54) ACRIDINE DERIVATIVES AND ORGANIC ELECTROLUMINESCENT DEVICE

(71) Applicant: WUHAN CHINA STAR OPTOELECTRONICS SEMICONDUCTOR DISPLAY TECHNOLOGY CO., LTD., Hubei (CN)

(72) Inventors: Jiajia Luo, Hubei (CN); Yu Gu, Hubei (CN); Jinchang Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 441 days.

(21) Appl. No.: 16/341,908

(22) PCT Filed: Dec. 24, 2018

(86) PCT No.: PCT/CN2018/123251
§ 371 (c)(1),
(2) Date: Apr. 14, 2019

(87) PCT Pub. No.: WO2020/082568
PCT Pub. Date: Apr. 30, 2020

(65) Prior Publication Data
US 2020/0161561 A1 May 21, 2020

(30) Foreign Application Priority Data
Oct. 25, 2018 (CN) .......................... 201811251536.5

(51) Int. Cl.
*H01L 51/50* (2006.01)
*H01L 51/00* (2006.01)
(Continued)

(52) U.S. Cl.
CPC ...... *H01L 51/0072* (2013.01); *C07F 9/65846* (2013.01); *C09K 11/06* (2013.01);
(Continued)

(58) Field of Classification Search
CPC ............ H01L 51/0072; H01L 51/5016; H01L 51/5056; H01L 51/5072; H01L 51/5088;
(Continued)

(56) References Cited

U.S. PATENT DOCUMENTS

2018/0287090 A1  10/2018  Sato

FOREIGN PATENT DOCUMENTS

WO    WO-2015080182 A1 *  6/2015  ................ C07F 7/30

OTHER PUBLICATIONS

WO-2015080182-A1—translation (Year: 2015).*

* cited by examiner

*Primary Examiner* — Jennifer A Boyd
*Assistant Examiner* — Rachel Simbana
(74) *Attorney, Agent, or Firm* — Mark M. Friedman

(57) ABSTRACT

An acridine derivative including a structure of formula (I) is provided. The acridine derivative can be used as a fluorescent material, in particular, it is included in an organic light-emitting layer as a dark blue thermally-activated delayed fluorescent material, thereby a series of high-performance electrothermally activated delayed fluorescent devices are produced.

10 Claims, 3 Drawing Sheets

Compound 1    Compound 2    Compound 3

(51) Int. Cl.
*C09K 11/06* (2006.01)
*C07F 9/6584* (2006.01)

(52) U.S. Cl.
CPC .. *C09K 2211/1018* (2013.01); *H01L 51/5016* (2013.01); *H01L 51/5056* (2013.01); *H01L 51/5072* (2013.01); *H01L 51/5088* (2013.01)

(58) Field of Classification Search
CPC ............ H01L 51/5012; H01L 51/0059; H01L 51/0071; H01L 51/0052; C07F 9/65846; C07F 9/6584; C09K 11/06; C09K 2211/1018; C09K 2211/1029; C09K 2211/104
See application file for complete search history.

ACRIDINE DERIVATIVES AND ORGANIC ELECTROLUMINESCENT DEVICE

FIELD OF INVENTION

The present application relates to the field of organic electroluminescence technology, and in particular to an acridine derivative, and an organic electroluminescent device and a display panel using the acridine derivative.

BACKGROUND OF INVENTION

Organic light-emitting diode (OLEDs) do not require a backlight because of their active illumination. OLEDs have advantages such as high luminous efficiency, wide viewing angles, fast response times, a wide temperature adaptation range, a simple production process, low driving voltage, low energy consumption, being lightweight, thinner, and bendable. In addition, its huge application prospects have attracted attention of many researchers.

In OLEDs, luminescent material plays a dominant and critical role, where luminescent materials, used in early OLEDs, are fluorescent materials. Since the ratio of excitons in singlet and triplet states is 1:3 in the OLEDs, the theoretical internal quantum efficiency (IQE) of the OLEDs based on fluorescent materials can only reach 25%, which greatly limits the application of fluorescent electroluminescent devices.

Heavy metal coordination complex phosphorescent materials can achieve 100% IQE by utilizing singlet and triplet excitons simultaneously due to a spin-orbit coupling of heavy atoms. However, the heavy metals commonly used are precious metals, such as Ir and Pt, and the heavy metal coordination complex phosphorescent materials are breakthrough in terms of the development of blue light materials.

Pure organic thermally activated delayed fluorescent (TADF) materials have a small minimum singlet-triplet energy level difference (ΔEST) by its ingenious molecular design, such that the triplet excitons can return to a singlet state by reverse intersystem crossing (RISC) and then illuminated by the radiation transition from a high energy level state to a ground state, so that the singlet and triplet excitons can be utilized simultaneously, and 100% IQE can also be achieved.

Technical Problem

For TADF materials, a fast reverse intersystem crossing constant ($k_{RISC}$) and a high photoluminescence quantum yield (PLQY) are essential requirements for the preparation of high-efficiency OLEDs. At present, the TADF materials meeting the above requirements are still relatively scarce compared to a heavy metal Jr complex. In the field of dark blue light where the revolutionized development of phosphorescent heavy metal materials is yet to be achieved, there are very few TADF materials.

Accordingly, new fluorescent materials need to be developed to address the technical gap in the field of dark blue light.

Technical Solution

An acridine derivative according to the present application is provided, a series of compounds having high singlet-triplet energy level are synthesized by ingenious molecular design. The acridine derivative can be used as a dark blue fluorescent material and further applied to an organic light-emitting layer of an organic electroluminescent device to obtain a series of high-performance OLEDs.

In order to achieve the above object, an acridine derivative including a structure of formula (I) is provided:

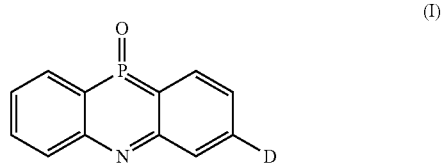

(I)

wherein D represents an electron donor unit, and the electron donor unit contains an acridine structure.

In one embodiment, the electron donor unit has a structure represented by formula (I-2), (I-3) or (I-4):

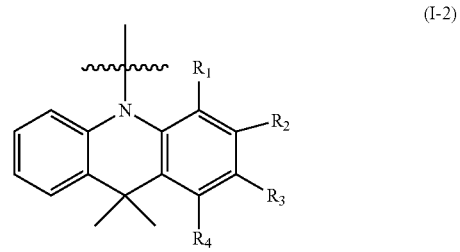

(I-2)

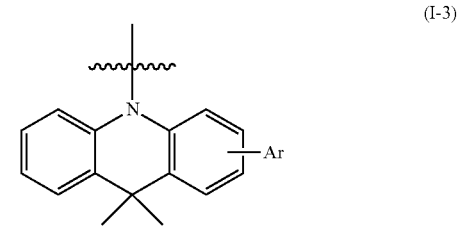

(I-3)

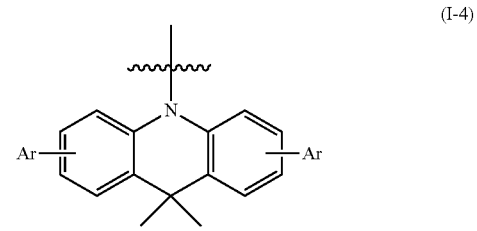

(I-4)

wherein $R_2$ is bonded to $R_1$ or $R_3$ to form an aromatic ring, or $R_3$ is bonded to $R_4$ to form an aromatic ring, and Ar is a substituted or unsubstituted aromatic hydrocarbon group.

In one embodiment, when $R_2$ is bonded to $R_1$ or $R_3$ to form an aromatic ring, and the electron donor unit has a structure represented by formula (I-2-a) or (I-2-b):

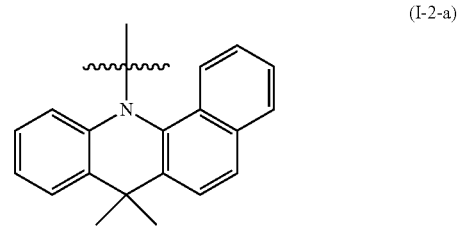

(I-2-a)

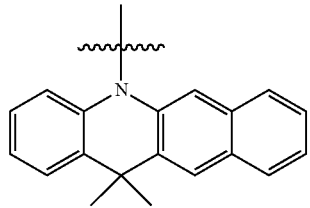
(I-2-b)

when the $R_3$ and $R_4$ are bonded to form an aromatic ring, the electron donor unit has a structure represented by formula (I-2-c):

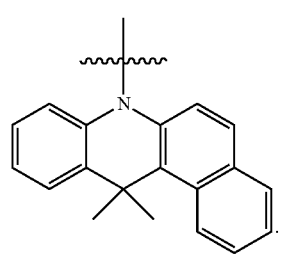
(I-2-c)

In one embodiment, the Ar represents a benzene ring.

In one embodiment, the electron donor unit has a structure represented by formula (I-3-a), (I-3-b), (I-3-c), (I-4-a), (I-4-b) or (I-4-c):

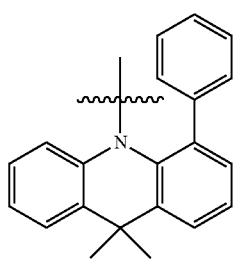
(I-3-a)

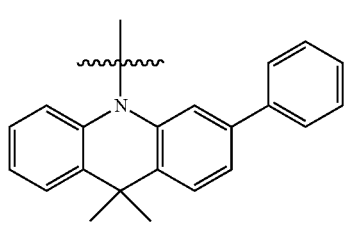
(I-3-b)

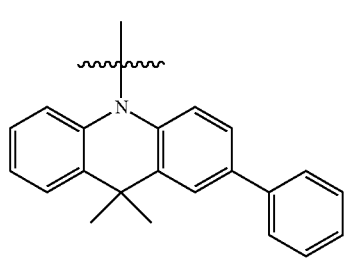
(I-3-c)

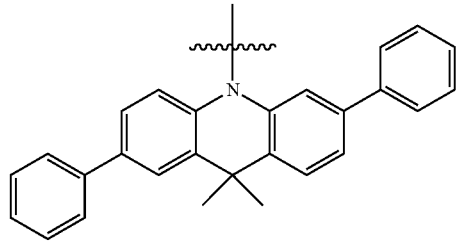
(I-4-a)

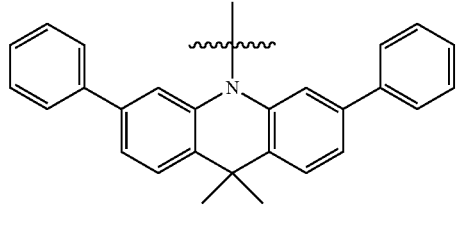
(I-4-b)

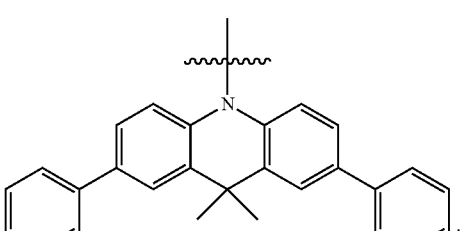
(I-4-c)

In one embodiment, the acridine derivative has a structure represented by compound 1, 2 or 3:

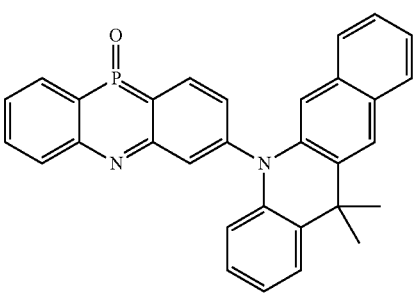
Compound 1

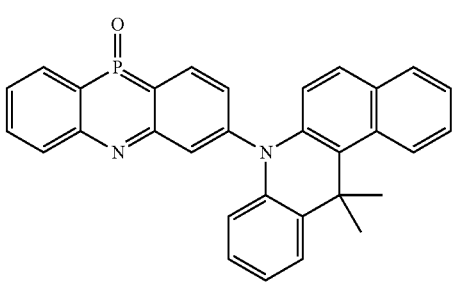
Compound 2

Compound 3

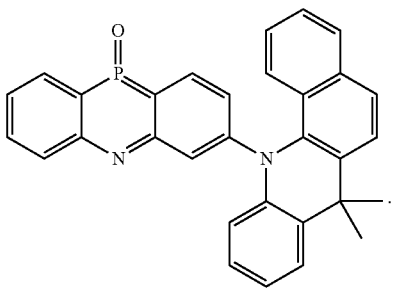

The present application also provides an organic electroluminescent device, including a first electrode, a second electrode, and at least one organic light-emitting layer disposed between the first electrode and the second electrode, wherein the organic light-emitting layer includes a fluorescent material selected from the above acridine derivative.

In one embodiment, the organic electroluminescent device further includes: a hole injection layer disposed between the first electrode and the organic light-emitting layer, a hole transport layer disposed between the hole injection layer and the organic light-emitting layer, and an electron transport layer disposed between the organic light-emitting layer and the second electrode.

The present application also provides a display panel including the organic electroluminescent device mentioned above.

Beneficial Effect

In this application, the objects of reducing the lowest singlet-triplet energy level difference and high energy level of the target molecule can be achieved by screening different electron donor units and adjusting the torsion angle and charge-transfer characteristics between the electron donor and the electron acceptor. Further, a series of compounds having high singlet-triplet energy levels and excellent luminescence performance can be synthesized.

These compounds can be used as fluorescent materials, in particular as dark blue thermal activated delayed fluorescent materials, and can be contained in the organic light-emitting layer, thereby a series of high-performance electrothermally activated delayed fluorescent devices can be produced.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

Figure 1:
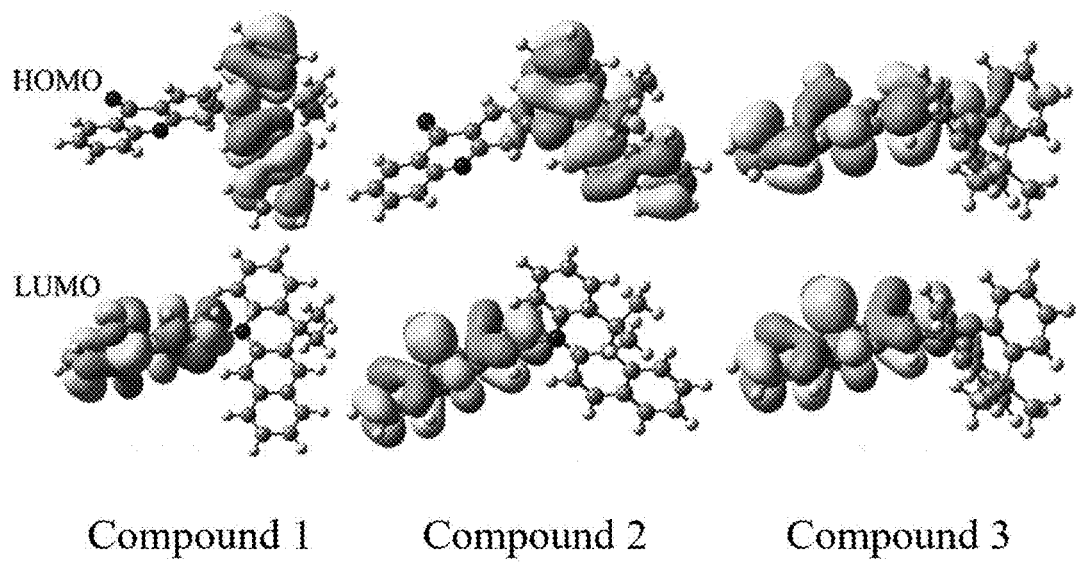
FIG. 1 is an orbital distribution diagram of compounds 1 to 3 described in embodiments 1 to 3 of the present invention.

The embodiments of the present invention are described in detail below. The embodiments are shown in the drawings, in which the same or similar reference numerals are used to denote the same or similar elements or elements having the same or similar functions. The embodiments described below with reference numerals to the drawings are intended to be illustrative of the invention and are not to be construed as limiting.

The following disclosure provides various embodiments or examples for achieving various structures of the present invention. In order to simplify the disclosure of the present invention, the components and arrangements of the specific examples are described below. It is obvious, they are merely examples and are not intended to limit the invention. In addition, the reference numerals or reference letters of the present invention may be reused in the various examples, which are for the purpose of simplicity and clarity, and do not indicate the relationship between the various embodiments and/or arrangements discussed. Moreover, the present invention provides examples of various specific processes and materials, but one of ordinary skill in the art would recognize the use of other processes and/or the use of other materials.

Embodiment 1, preparation of compound 1

In this embodiment, an acridine derivative having a structure represented by compound 1 is provided:

Compound 1

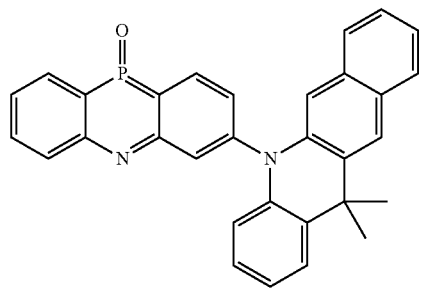

The synthetic route of the compound 1 is as follows:

-continued

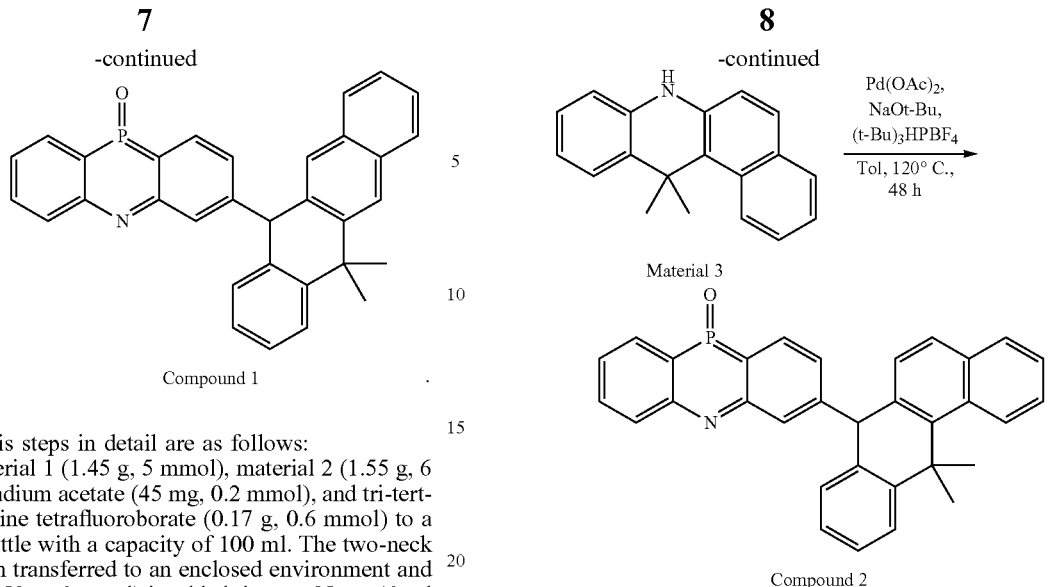

Compound 1

The synthesis steps in detail are as follows:
1. Adding material 1 (1.45 g, 5 mmol), material 2 (1.55 g, 6 mmol), palladium acetate (45 mg, 0.2 mmol), and tri-tert-butylphosphine tetrafluoroborate (0.17 g, 0.6 mmol) to a two-neck bottle with a capacity of 100 ml. The two-neck bottle is then transferred to an enclosed environment and NaOt-Bu (0.58 g, 6 mmol) is added thereto. Next, 40 ml of toluene dehydrated and deoxygenated in advance is injected to the two-neck bottle under an argon atmosphere, and reacted at 120° C. for 48 hours.
2. After the reaction solution is cooled to room temperature, the reaction solution is poured into 50 ml of ice water and the solution is extracted with dichloromethane three times. An organic phase obtained by an extraction is combined, and immediately separated and purified by silica gel column chromatography (dichloromethane: n-hexane, v: v, 3:1) to give a blue-white powder of 2.0 g, yield 85%. $^1$H NMR (300 MHz, CD$_2$Cl$_2$, δ): 7.79; (d, J=6.9 Hz, 1H), 7.70; (d, J=6.6 Hz, 1H), 7.43-7.28; (m, 6H), 7.20-7.14; (m, 4H), 6.93-6.87; (m, 3H), 6.20; (d, J=6.6 Hz, 1H), 5.67; (s, 1H), 1.75; (s, 6H). MS (EI) m/z: [M]$^+$ calcd for C$_{31}$H$_{23}$N$_2$OP, 470.15; found, 470.09. Anal. Calcd for 470.15: C 79.14, H 4.93, N 5.95; found: C 79.07, H 5.07, N 5.82.

Embodiment 2, preparation of compound 2
In this embodiment, an acridine derivative having a structure represented by compound 2 is provided:

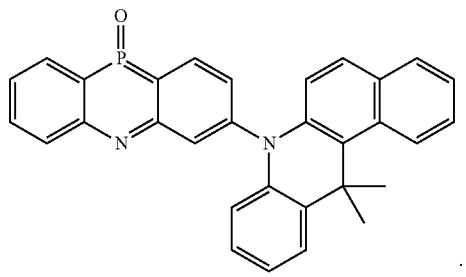

Compound 2

The synthetic route of the compound 2 is as follows:

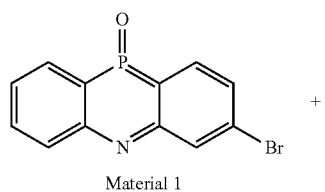

Material 1

+

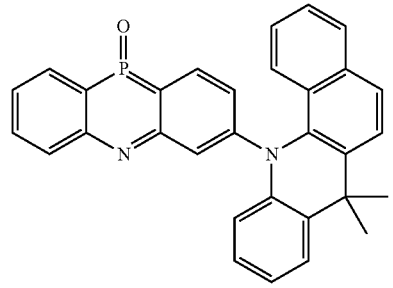

Material 3

Compound 2

The synthesis steps in detail are as follows:
1. Adding material 1 (1.45 g, 5 mmol), material 3 (1.55 g, 6 mmol), palladium acetate (45 mg, 0.2 mmol), and tri-tert-butylphosphine tetrafluoroborate (0.17 g, 0.6 mmol) to a two-neck bottle with a capacity of 100 ml. The two-neck bottle is then transferred to an enclosed environment and NaOt-Bu (0.58 g, 6 mmol) is added thereto. Next, 40 ml of toluene dehydrated and deoxygenated in advance is injected to the two-neck bottle under an argon atmosphere, and reacted at 120° C. for 48 hours;
2. After the reaction solution is cooled to room temperature, the reaction solution is poured into 50 ml of ice water and extracted with dichloromethane three times. The organic phase obtained by the extraction is combined, and immediately separated and purified by silica gel column chromatography (dichloromethane: n-hexane, v: v, 3:1) to give a blue-white powder of 1.7 g, yield 72%. $^1$H NMR (300 MHz, CD$_2$Cl$_2$, δ): 7.96; (d, J=6.6 Hz, 1H), 7.88; (d, J=6.0 Hz, 1H), 7.79; (d, J=6.3 Hz, 1H), 7.61-7.50; (m, 4H), 7.48-7.37; (m, 4H), 7.27-7.00; (m, 4H), 6.20; (d, J=6.6 Hz, 1H), 5.67; (s, 1H), 1.82; (s, 6H). MS (EI) m/z: [M]$^+$ calcd for C$_{31}$H$_{23}$N$_2$OP, 470.15; found, 470.13. Anal. Calcd for 470.15: C 79.14, H 4.93, N 5.95; found: C 79.00, H 4.87, N 5.89.

Embodiment 3, preparation of compound 3
In this embodiment, an acridine derivative having a structure represented by compound 3 is provided:

Compound 3

The synthetic route of the compound 3 is as follows:

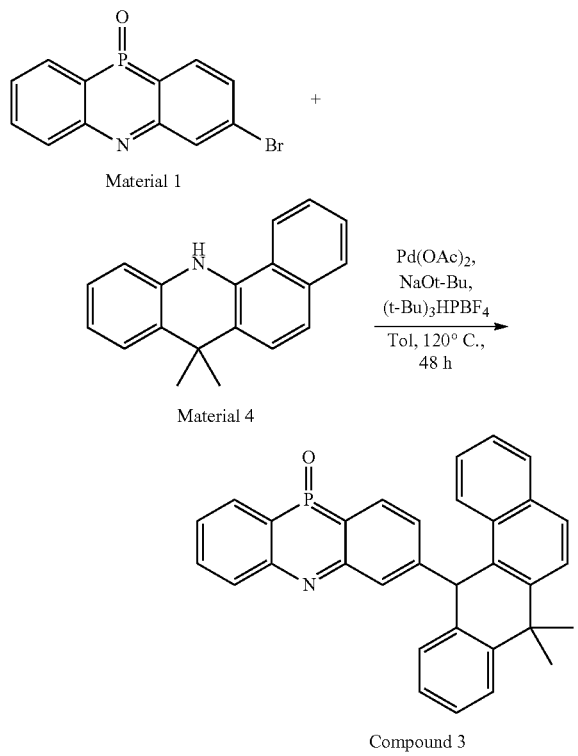

The synthesis steps in detail are as follows:
1. Adding material 1 (1.45 g, 5 mmol), material 4 (1.55 g, 6 mmol), palladium acetate (45 mg, 0.2 mmol), and tri-tert-butylphosphine tetrafluoroborate (0.17 g, 0.6 mmol) to a two-neck bottle with a capacity of 100 ml. The two-neck bottle is then transferred to an enclosed environment and NaOt-Bu (0.58 g, 6 mmol) is added thereto. Next, 40 ml of toluene dehydrated and deoxygenated in advance is injected to the bottle under an argon atmosphere, and reacted at 120° C. for 48 hours;
2. After the reaction solution is cooled to room temperature, the reaction solution is poured into 50 ml of ice water and extracted with dichloromethane three times. The organic phase obtained by the extraction is combined, and immediately separated and purified by silica gel column chromatography (dichloromethane: n-hexane, v: v, 3:1) to give a blue-white powder of 1.1 g, yield 47%. $^1$H NMR (300 MHz, CD$_2$Cl$_2$, δ): 8.13; (d, J=6.9 Hz, 1H), 8.06; (d, J=6.6 Hz, 1H), 7.69; (d, J=6.9 Hz, 1H), 7.49-7.40; (m, 3H), 7.36-7.17; (m, 9H), 6.20; (d, J=6.6 Hz, 1H), 5.67; (s, 1H), 1.75; (s, 6H). MS (EI) m/z: [M]$^+$ calcd for C$_{31}$H$_{23}$N$_2$OP, 470.15; found, 470.11. Anal. Calcd for 470.15: C 79.14, H 4.93, N 5.95; found: C 79.11, H 5.00, N 5.76.

Embodiment 4, test and experimental verification of compounds 1-3
In the present embodiment, the compounds 1 to 3 obtained in embodiments 1 to 3 are tested and experimentally verified.

Please refer to FIG. 1, FIG. 1 is an orbital distribution diagram of the compounds 1 to 3. The electron cloud distribution of a highest occupied molecular orbital (HOMO) and a lowest unoccupied molecular orbital (LUMO) of compounds 1 to 3 are shown respectively in FIG. 1. The lowest singlet state (S$_1$), the lowest triplet state energy level (T$_1$), and the electrochemical energy level of the compounds 1 to 3 shown in Table 1 were obtained by theoretical simulation.

TABLE 1 the lowest singlet state (S$_1$), the lowest triplet state energy level (T$_1$), and the electrochemical energy level of compounds 1~3

| | PL Peak (nm) | S$_1$ (eV) | T$_1$ (eV) | ΔE$_{ST}$ (eV) | HOMO (eV) | LUMO (eV) |
|---|---|---|---|---|---|---|
| Compound 1 | 422 | 2.94 | 2.87 | 0.07 | −5.48 | −2.00 |
| Compound 2 | 427 | 2.91 | 2.80 | 0.11 | −5.65 | −2.00 |
| Compound 3 | 464 | 2.67 | 2.32 | 0.35 | −5.22 | −2.00 |

Figure 2:
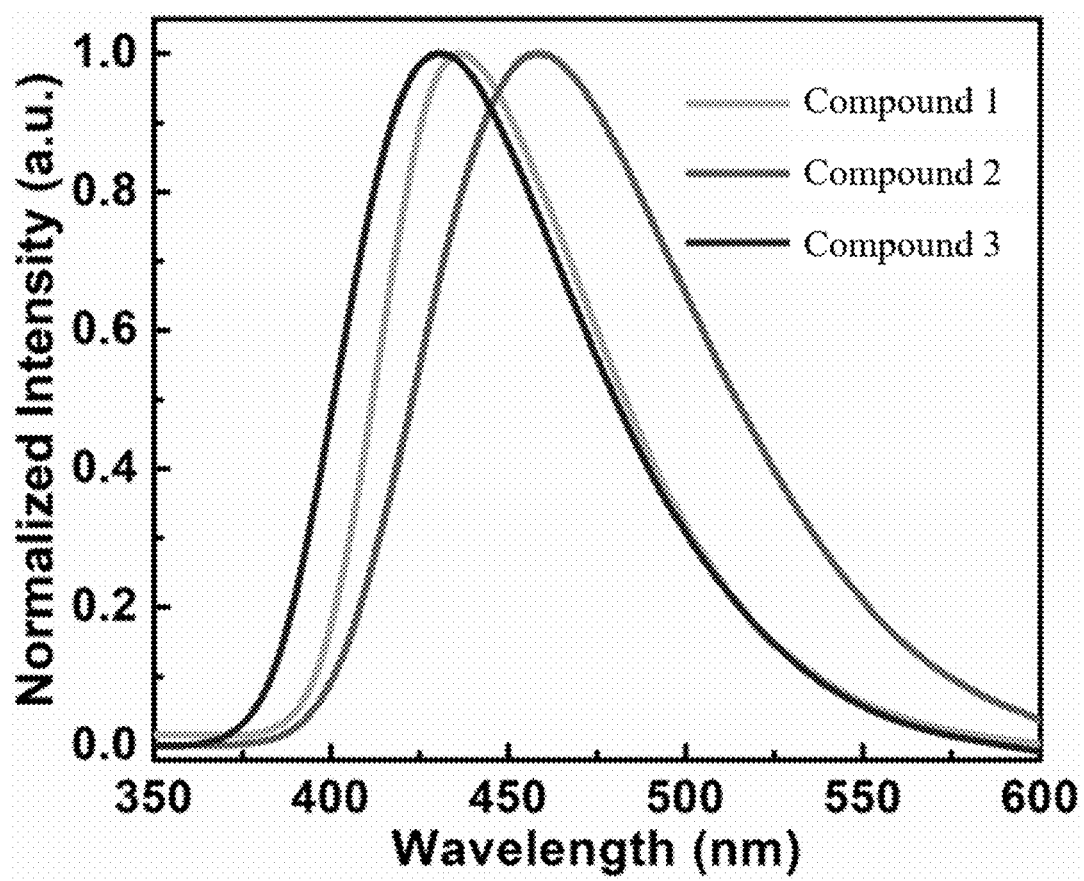
FIG. 2 is a photoluminescence spectrum of the compounds 1 to 3 in a toluene solution at room temperature.
Figure 3:
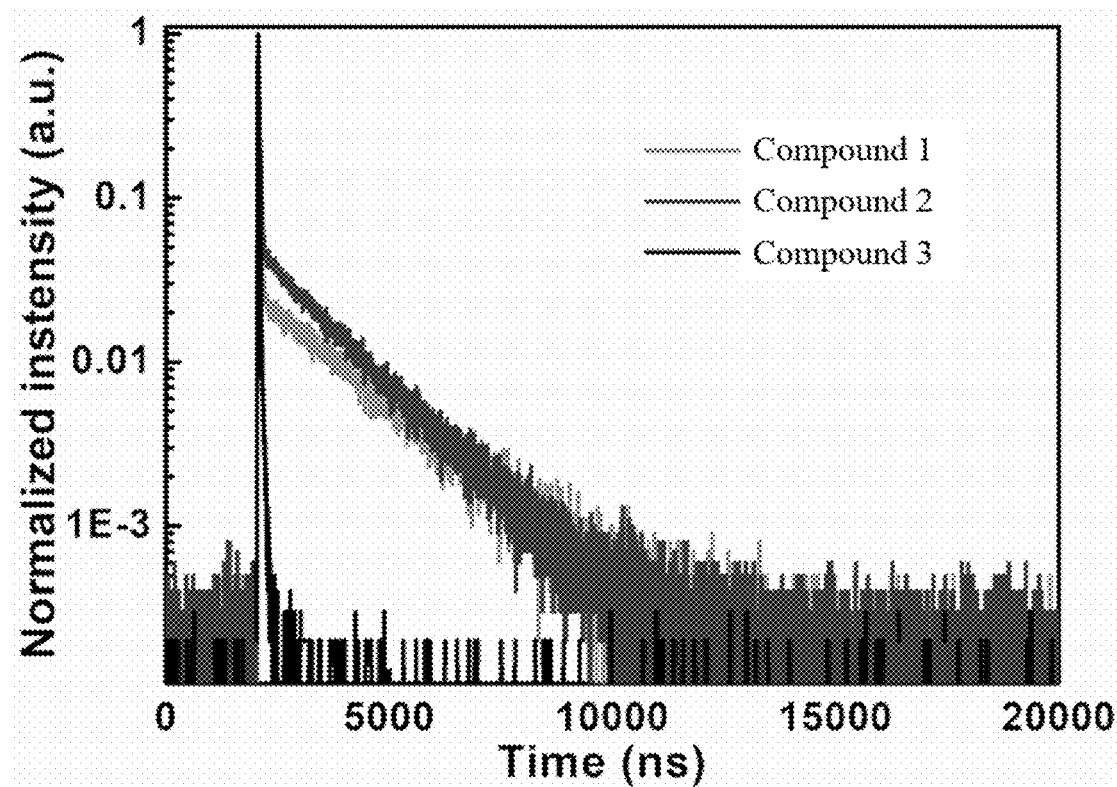
FIG. 3 is a transient photoluminescence spectrum of the compounds 1 to 3 in the toluene solution at room temperature.

Further, in this embodiment, the photophysical properties of the compounds 1 to 3 are further experimentally verified, and the photoluminescence spectrum of the compounds 1 to 3 in a toluene solution at room temperature shown in FIG. 2 and a transient photoluminescence spectrum of the compounds 1 to 3 in the toluene solution at room temperature shown in FIG. 3 were obtained.

From the above experimental data, it is noted that the target compound has a very high triplet state energy level and is suitable for use as a blue dopant material in the OLED.

Embodiment 5, an organic electroluminescent device

Figure 4:
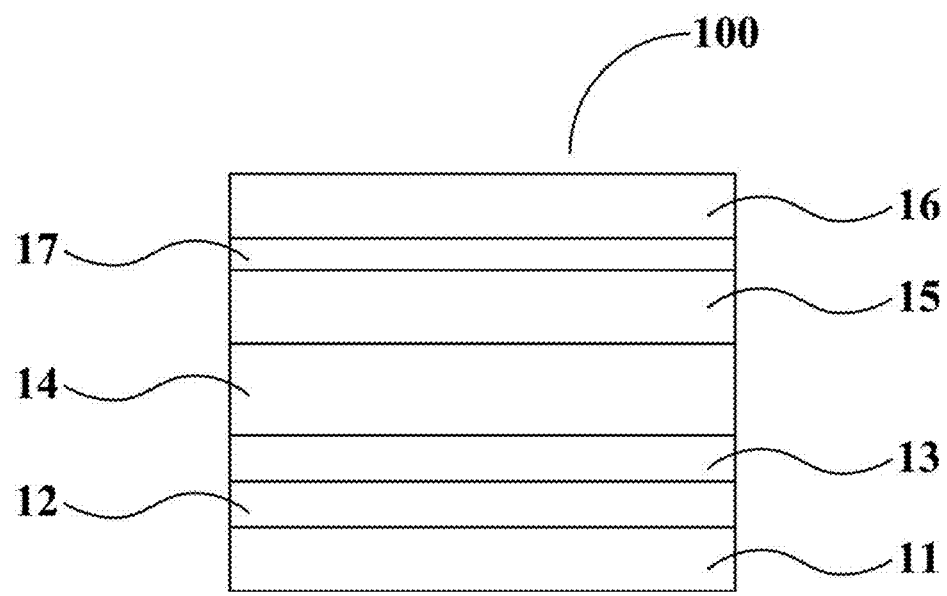
FIG. 4 is a schematic structural view of an organic electroluminescent device according to an embodiment of the invention.

In this embodiment, an organic electroluminescent device is provided. As shown in FIG. 4, the organic electroluminescent device 100 includes, in order, a first electrode 11, a hole injection layer 12, a hole transport layer 13, an organic light-emitting layer 14, an electron transport layer 15, and a second electrode 16. The organic light-emitting layer 14 includes a dark blue thermally activated delayed fluorescent material, the dark blue thermally activated delayed fluorescent material is at least one of the compounds 1 to 3.

It can be understood by those skilled in the art that the organic electroluminescent device 100 shown in FIG. 4 is only an example, those skilled in the art can increase or decrease some functional layers according to actual process needs. For example, an electron injection layer 17 can be disposed between the electron transport layer 15 and the second electrode 16. Further, each of the above layers is formed by a conventional process and a conventional material in the art.

For example, the first electrode 11 is an anode and may be made of indium tin oxide (ITO).

For example, the hole injection layer 12 may be made of poly (3,4-ethylenedioxythiophene)-polystyrenesulfonic acid (PEDOT:PSS), polythiophene or polyaniline.

For example, the hole transport layer 13 can be made of an aromatic diamine compound, a triphenylamine compound, an aromatic triamine compound, a biphenyl diamine derivative, a triarylamine polymer or a carbazole polymer.

For example, bis ((oxo) diphenylphosphino) phenyl] ether (DPEPO) is functioned as a light-emitting main substance in the organic light-emitting layer 14 and is doped with at least one of the compounds 1 to 3.

For example, the electron transport layer 15 may be made of 1,3,5-tris (3-(3-pyridyl) phenyl) benzene (Tm3PyPB).

For example, the second electrode 16 is a cathode and may be made of Al or Mg/Ag.

For example, the electron injection layer 17 may be made of LiF.

For example, the manufacturing method of the organic electroluminescent device 100 in detail is as follows:

PESOT: PSS is spin-coated on a cleaned ITO substrate, and then TmPyPB, LiF, and Al are evaporated, in order, on the substrate under a high vacuum.

In this embodiment, the organic electroluminescent device containing the compound 1 in its organic light-emitting layer 14 is referred to as device A, an organic electroluminescent device containing the compound 2 in its organic light-emitting layer 14 is referred to as device B, and an organic electroluminescent device containing the compound 3 in its organic light-emitting layer 14 is referred to as device C.

As one embodiment, the structures of the device A, device B, and device C in detail are as follows:

Device A: ITO/PEDOT: PSS (50 nm)/DPEPO: Compound 1 (3% 40 nm)/TmPyPB (40 nm)/LiF (1 nm)/Al (100 nm); Device B: ITO/PEDOT: PSS (50 nm)/DPEPO: Compound 2 (5% 40 nm)/TmPyPB (40 nm)/LiF (1 nm)/Al (100 nm); Device C: ITO/PEDOT: PSS (50 nm)/DPEPO: Compound 3 (5% 40 nm)/TmPyPB (40 nm)LiF (1 nm)/Al (100 nm).

The electroluminescence spectra of the above device A, device B, and device C are measured by a French JY Company SPEX CCD3000 spectrometer, and the performance data as shown in Table 2 was obtained by calculation. In addition, the current-luminance-voltage characteristics of the above device A, device B, and device C can also be detected using a Keithley source measurement system (Keithley 2400 Sourcemeter, Keithley 2000 Currentmeter).

TABLE 2 the performance data for devices A-C

| Device | Highest Current Efficiency (cd/A) | CIE Coordinate | Maximum External Quantum Efficiency (%) |
|---|---|---|---|
| A | 19.8 | (0.13, 0.09) | 16.1 |
| B | 21.5 | (0.14, 0.10) | 15.7 |
| C | 7.3 | (0.20, 0.25) | 3.9 |

It is shown by the above data that the electroluminescence chromaticity of device A, device B, and device C is dark blue.

Embodiment 6, a display panel

Figure 5:
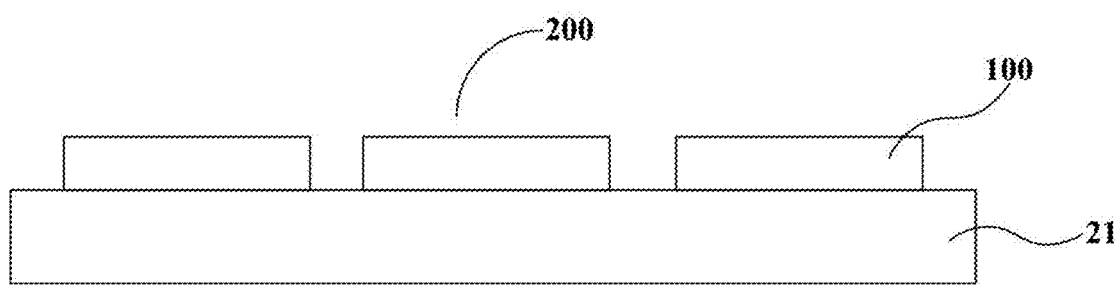
FIG. 5 is a schematic structural view of a display panel according to an embodiment of the invention.

In this embodiment, a display panel is provided. As shown in FIG. 5, the display panel 200 includes:

A substrate 21 on which a plurality of the organic electroluminescent devices 100 is formed. The organic electroluminescent device 100 may, in particular, be device A, device B or device C. Those skilled in the art can understand that the substrate 21 may also be formed with a structure that has undergone a number of the above processes, for example, an inorganic film layer, several film layers of a thin film transistor structure or a complete thin film transistor and wiring may be formed on the substrate. It is obvious that the display panel 200 also includes other known structures such as a package cover, which are not described herein.

In this invention, by screening different electron donor units and adjusting a torsion angle and charge-transfer characteristics between an electron donor and an electron acceptor to achieve the object of reducing the lowest singlet-triplet energy level difference and a high energy level of a target molecule, further, a series of compounds having high singlet-triplet energy levels and excellent luminescence performance can be synthesized. These compounds can be used as fluorescent materials, in particular as dark blue thermal activated delayed fluorescent materials, and can be contained in the organic light-emitting layer, thereby a series of high-performance electrothermally activated delayed fluorescent devices can be produced.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

Industrial applicability The subject of the present application can be manufactured and used in the industry and has industrial applicability.

What is claimed is:

1. An acridine derivative, comprising a structure of formula (I):

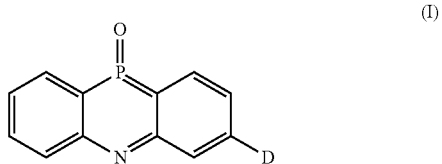

wherein D represents an electron donor unit having a structure represented by formula (I-2-a), (I-2-b), (I-2-c), (I-3-a), (I-3-b), (I-3-c), (I-4-a), (I-4-b) or (I-4-c):

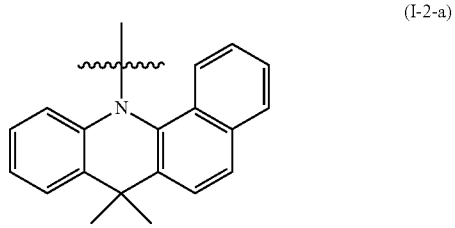

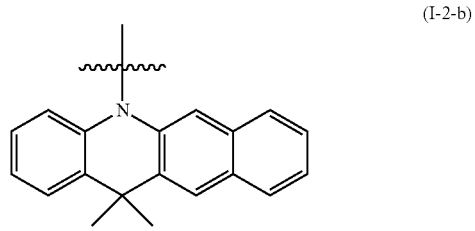

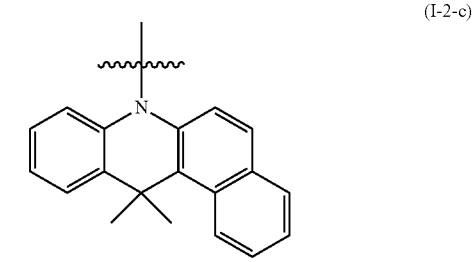 [SMILES: *N1c2ccccc2C(C)(C)c2c1ccc1ccccc21]

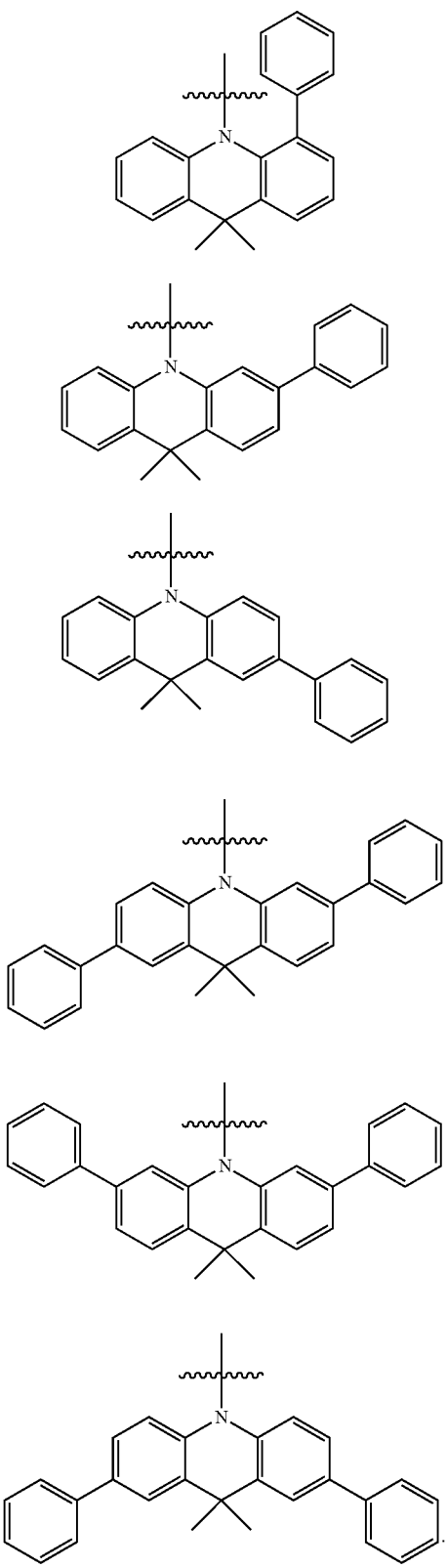

2. The acridine derivative according to claim 1, wherein the acridine derivative has a structure represented by compounds 1, 2 or 3:

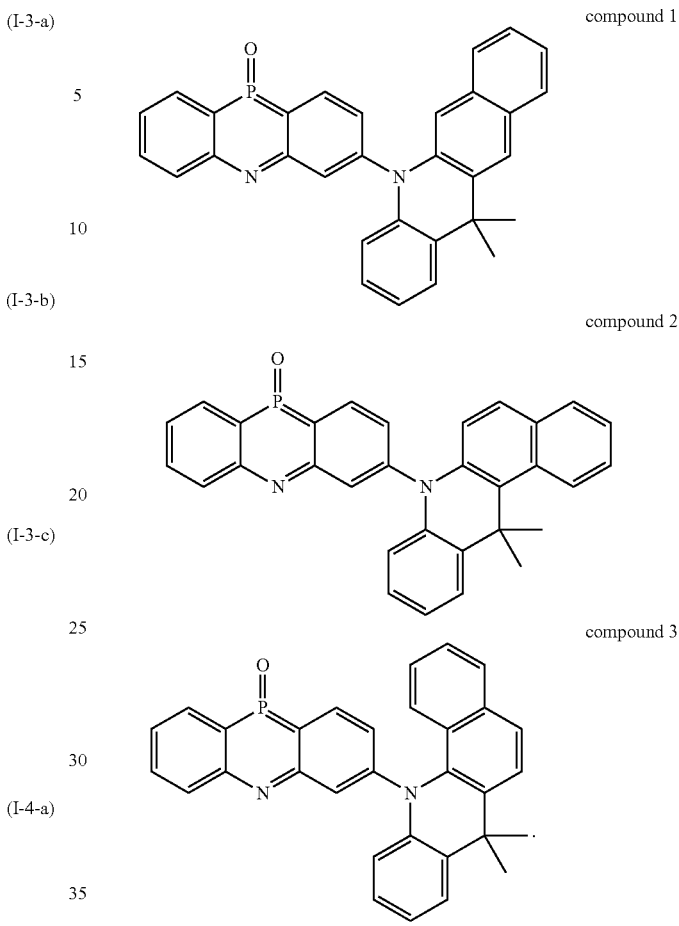

3. An acridine derivative, comprising a structure of formula (I):

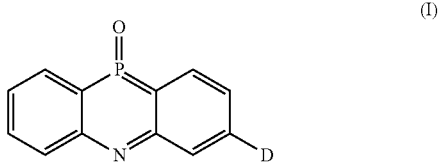

wherein D represents an electron donor unit, and the electron donor unit contains an acridine structure.

4. The acridine derivative according to claim 3, wherein the electron donor unit has a structure represented by formula (I-2), (I-3) or (I-4):

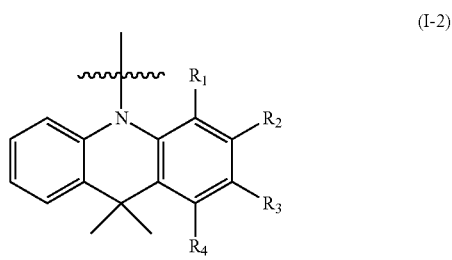

-continued (I-3)
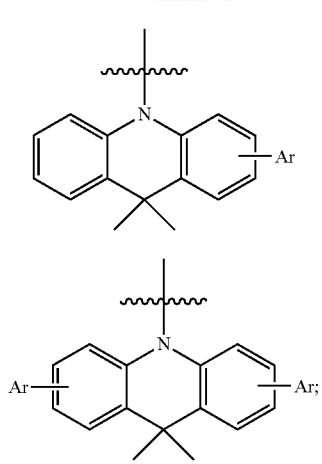

(I-4)

wherein, in formula (I-2), $R_2$ is bonded to $R_1$ or $R_3$ to form an aromatic ring, or $R_3$ is bonded to $R_4$ to form an aromatic ring, and in formula (I-3) or (I-4), Ar is a substituted or an unsubstituted aromatic hydrocarbon group.

5. The acridine derivative according to claim 4, wherein when $R_2$ is bonded to $R_1$ or $R_3$ to form an aromatic ring, the electron donor unit represented by formula (I-2), has a structure represented by one of formula (I-2-a) or (I-2-b):

(I-2-a)
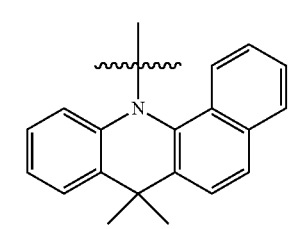

(I-2-b)
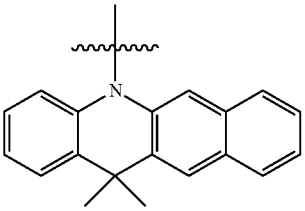

and when $R_3$ and $R_4$ are bonded to form an aromatic ring, the electron donor unit represented by formula (I-2) has a structure represented by formula (I-2-c):

(I-2-c)
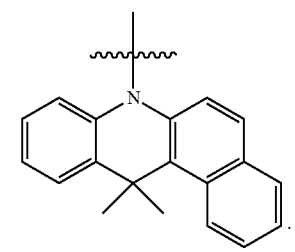

6. The acridine derivative according to claim 4, wherein when the electron donor unit has a structure represented by formula (I-3) or (I-4), Ar represents a benzene ring.

7. The acridine derivative according to claim 6, wherein the electron donor unit has a structure represented by formula (I-3-a), (I-3-b), (I-3-c), (I-4-a), (I-4-b) or (I-4-c):

(I-3-a)
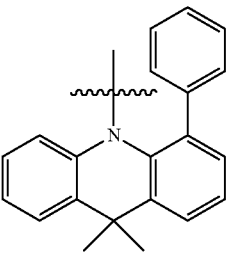

(I-3-b)
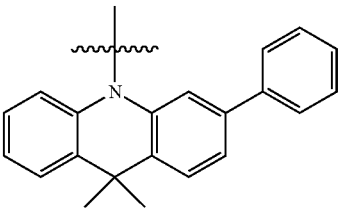

(I-3-c)
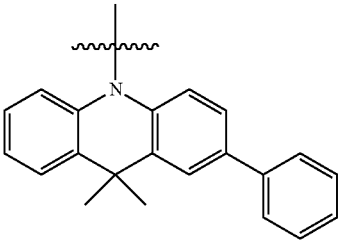

(I-4-a)
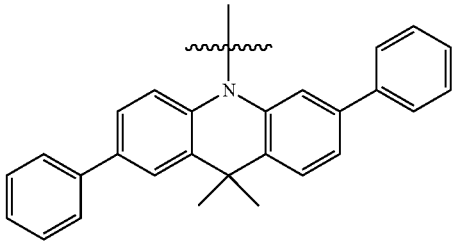

(I-4-b)
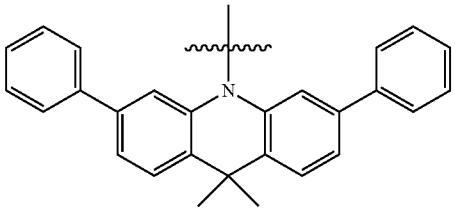

-continued (I-4-c)

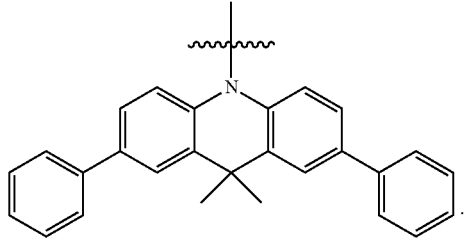

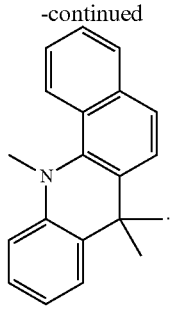

8. The acridine derivative according to claim 3, wherein the electron donor unit is selected from

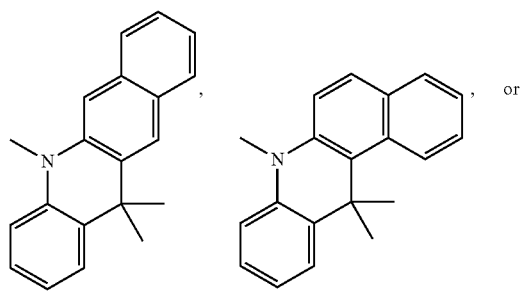, or

9. An organic electroluminescent device, comprising a first electrode, a second electrode, and at least one organic light-emitting layer disposed between the first electrode and the second electrode, wherein the organic light-emitting layer comprises a fluorescent material selected from the acridine derivative of claim 1.

10. The organic electroluminescent device according to claim 9, wherein the organic electroluminescent device further comprises:
a hole injection layer disposed between the first electrode and the organic light-emitting layer, a hole transport layer disposed between the hole injection layer and the organic light-emitting layer, and an electron transport layer disposed between the organic light-emitting layer and the second electrode.

* * * * *